(12) United States Patent
Zhang

(10) Patent No.: US 12,652,889 B2
(45) Date of Patent: Jun. 9, 2026

(54) SEMICONDUCTOR DEVICES AND MANUFACTURING METHOD THEREOF

(71) Applicant: ENKRIS SEMICONDUCTOR, INC., Suzhou (CN)

(72) Inventor: Liyang Zhang, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 426 days.

(21) Appl. No.: 18/308,534

(22) PCT Filed: Nov. 20, 2020

(86) PCT No.: PCT/CN2020/130406
§ 371 (c)(1),
(2) Date: Apr. 27, 2023

(87) PCT Pub. No.: WO2022/104690
PCT Pub. Date: May 27, 2022

(65) Prior Publication Data
US 2025/0081676 A1 Mar. 6, 2025

(51) Int. Cl.
*H10H 20/83* (2025.01)
*H10H 20/00* (2025.01)
(Continued)

(52) U.S. Cl.
CPC ...... *H10H 20/8312* (2025.01); *H10H 20/856* (2025.01); *H10H 20/857* (2025.01);
(Continued)

(58) Field of Classification Search
CPC .. H01L 25/167; H10H 29/14; H10H 20/8312; H10H 20/856; H10H 20/857;
(Continued)

(56) References Cited

U.S. PATENT DOCUMENTS

2006/0220060 A1* 10/2006 Nakata ............... H10D 30/4755
257/E29.127
2013/0105811 A1* 5/2013 Ando ................. H10D 62/8503
438/285
(Continued)

FOREIGN PATENT DOCUMENTS

CN 107994047 A 5/2018
CN 110010542 A 7/2019
(Continued)

OTHER PUBLICATIONS

State Intellectual Property Office of the People's Republic of China, Office Action and Search Report Issued in Application No. 2020801070471, Feb. 14, 2025, 18 pages. (Submitted with Machine Translation).
(Continued)

*Primary Examiner* — Omar F Mojaddedi
(74) *Attorney, Agent, or Firm* — Carroll, Hoette & Butscher, LLC; Christopher R. Carroll

(57) ABSTRACT

The present application provides a semiconductor device and a manufacturing method thereof. The manufacturing method of the semiconductor device includes: first forming a first conductive layer on a substrate, where the first conductive layer includes a heavily-doped group III-V compound, then forming an isolation structure on the first conductive layer, then growing a light-emitting structure by using the isolation structure as a mask, where the light-emitting structure includes a first semiconductor layer, an active layer and a second semiconductor layer which are sequentially stacked on the first conductive layer, and a conductivity type of the first semiconductor layer is opposite to a conductivity type of the second semiconductor layer.

14 Claims, 7 Drawing Sheets

(51) Int. Cl.

| | |
|---|---|
| *H10H 20/831* | (2025.01) |
| *H10H 20/85* | (2025.01) |
| *H10H 20/856* | (2025.01) |
| *H10H 20/857* | (2025.01) |
| *H10H 29/14* | (2025.01) |
| *H10W 90/00* | (2026.01) |
| *H10H 20/01* | (2025.01) |
| *H10H 20/825* | (2025.01) |
| *H10H 20/832* | (2025.01) |

(52) U.S. Cl.
CPC ............ *H10H 29/14* (2025.01); *H10W 90/00* (2026.01); *H10H 20/032* (2025.01); *H10H 20/0364* (2025.01); *H10H 20/825* (2025.01); *H10H 20/835* (2025.01)

(58) Field of Classification Search
CPC ........... H10H 20/0032; H10H 20/0364; H10H 20/825; H10H 20/835; H10H 20/832; H10H 20/032; H10W 90/00
See application file for complete search history.

(56) References Cited

U.S. PATENT DOCUMENTS

| | | | | |
|---|---|---|---|---|
| 2013/0214247 | A1* | 8/2013 | Hu | ....................... H10H 20/811 |
| | | | | 438/47 |
| 2016/0233329 | A1* | 8/2016 | Cheng | .................. H10D 30/475 |
| 2019/0214529 | A1* | 7/2019 | Ahmed | ................ H10H 20/825 |
| 2020/0343296 | A1* | 10/2020 | Gasse | .................. H10H 20/855 |
| 2022/0013577 | A1* | 1/2022 | Kishimoto | ....... H10H 20/01335 |

FOREIGN PATENT DOCUMENTS

| | | |
|---|---|---|
| CN | 110246953 A | 9/2019 |
| EP | 3542948 A1 | 9/2019 |
| WO | 2018143525 A1 | 8/2018 |
| WO | 2020136846 A1 | 7/2020 |
| WO | 2020136848 A1 | 7/2020 |

OTHER PUBLICATIONS

Gu Xing et al, "Processing technique of III-nitrides-based light emitting diodes", Micronanoelectronic Technology, Feb. 2003, 4 pages. (Submitted with Abstract Translation).

ISA State Intellectual Property Office of the People's Republic of China, International Search Report Issued in Application No. PCT/CN2020/130406, Aug. 18, 2021, WIPO, 4 pages.

ISA State Intellectual Property Office of the People's Republic of China, Written Opinion of the International Searching Authority Issued in Application No. PCT/CN2020/130406, Aug. 18, 2021, WIPO, 6 pages. (Submitted with Machine Partial Translation).

TW Patent Office, Office Action Issued in Application No. 110141629, Apr. 29, 2022, 8 pages. (Submitted with Machine/Partial Translation).

\* cited by examiner

14

141   142   143

13

12

11

14

141   142   143

22

13

12

11

SEMICONDUCTOR DEVICES AND MANUFACTURING METHOD THEREOF

CROSS REFERENCE TO RELATED APPLICATIONS

This application is a US National Phase of a PCT Application No. PCT/CN2020/130406 filed on Nov. 20, 2020, the entire contents of which are incorporated herein by reference in their entireties.

TECHNICAL FIELD

The present application relates to the technology field of semiconductor, and more particular, to a semiconductor structure and a manufacturing method thereof.

BACKGROUND

In the related technology, Micro-LED (Micro Light-Emitting Diode) is a new type of display technology with the advantages of high brightness and high luminous efficiency.

However, in the process of manufacturing the Micro-LED, the Micro-LED generally need to be transferred to a temporary carrier plate, multiple transfers may be needed, the specific number of transfers varies depending on the actual manufacturing process, and finally the Micro-LED is transferred to the drive circuit board. Multiple transfers may lead to a decrease in yield and increase production costs.

In view of this, it is necessary to provide a new semiconductor device and a method of manufacturing a semiconductor structure to meet the above needs.

SUMMARY

A purpose of the present application is to provide a semiconductor device and a manufacturing method thereof, which can reduce the number of transfers to improve the yield rate and reduce the costs.

To achieve the above purpose, a first aspect of the present application provides a method of manufacturing a semiconductor device which includes:

forming a first conductive layer on a substrate, where the first conductive layer includes a heavily-doped group III-V compound;

forming an isolation structure on the first conductive layer;

growing a light-emitting structure by using the isolation structure as a mask; where the light-emitting structure includes a first semiconductor layer, an active layer and a second semiconductor layer which are sequentially stacked on the first conductive layer, and a conductivity type of the first semiconductor layer is opposite to a conductivity type of the second semiconductor layer.

Optionally, the method of manufacturing a semiconductor device further includes:

forming a first electrode and a second electrode, where the first electrode is electrically connected to the first conductive layer through a first through-hole within the isolation structure, and the second electrode is located on the second semiconductor layer and is electrically connected to the second semiconductor layer.

Optionally, forming the first electrode and the second electrode includes:

forming the first through-hole within the isolation structure, where the first through-hole penetrates through the isolation structure;

forming the first electrode in the first through-hole, where one end of the first electrode is electrically connected to the first conductive layer, and an other end of the first electrode higher than the isolation structure; and forming the second electrode on the second semiconductor layer.

Optionally, the method of manufacturing a semiconductor device further includes:

forming a second through-hole in the isolation structure and the first conductive layer, where the second through-hole penetrates through the isolation structure and the first conductive layer;

forming a first insulating dielectric layer in the second through-hole, and forming a second insulating dielectric layer between the first electrode and the second electrode which are adjacent with each other to obtain an intermediate transition structure.

Optionally, after the intermediate transition structure is obtained, the method further includes:

transferring the intermediate transition structure to a drive circuit board, where the drive circuit board includes a first pad and a second pad, the first electrode corresponds to the first pad, and the second electrode corresponds to the second pad;

welding the first electrode to the first pad and the second electrode to the second pad;

removing the substrate to obtain the semiconductor device.

Optionally, before forming the first electrode and the second electrode, the method further includes:

forming a reflector on the light-emitting structure, where the material of the reflector is a conductive material.

Optionally, adjacent multiple light-emitting structures form a light-emitting unit, the multiple light-emitting structures in the light-emitting unit are connected in series through the first conductive layer. The light-emitting unit further includes a plurality of the first electrodes and a plurality of the second electrodes. One of the plurality of first electrodes are welded to the first pad, and the remaining first electrodes are not welded to the first pad. The plurality of the second electrodes are welded correspondingly to a plurality of the second pads one by one.

A second aspect of the present application provides a semiconductor device which includes a first conductive layer an isolation structure and a light-emitting structure.

The first conductive layer includes a heavily-doped group III-V compound.

The isolation structure is located on the first conductive layer.

The light-emitting structure is in the isolation structure; the light-emitting structure includes a first semiconductor layer, an active layer and a second semiconductor layer which are sequentially stacked on the first conductive layer, and a conductivity type of the first semiconductor layer opposites to a conductivity type of the second semiconductor layer.

Optionally, the semiconductor device further includes:

a first electrode and a second electrode. The first electrode are electrically connected to the first conductive layer through a first through-hole within the isolation structure. The second electrode is located on the second semiconductor layer and is electrically connected to the second semiconductor layer.

Optionally, the first through-hole is located within the isolation structure and penetrate through the isolation structure. The first electrode is located in the first through-hole. One end of the first electrode is electrically connected to the first conductive layer, and an other end of the first electrode protrudes from the isolation structure.

The semiconductor device further includes:

a second through-hole penetrating through the isolation structure and the first conductive layer; and a first insulating dielectric layer and a second insulating dielectric layer, where the first insulating dielectric layer is located in the second through-hole, and the second insulating dielectric layer is located between the first electrode and the second electrode which are adjacent with each other.

Optionally, the semiconductor device further includes a reflector.

The reflector is located between the second electrode and the second semiconductor layer, and a material of the reflector is a conductive material.

Optionally, the semiconductor device further includes a drive circuit board.

The drive circuit board includes a first pad and a second pad, the first electrode is welded to the first pad, and the second electrode is welded to the second pad.

Optionally, adjacent multiple light-emitting structures form a light-emitting unit, the multiple light-emitting structures in the light-emitting unit are connected in series through the first conductive layer. The light-emitting unit further includes a plurality of the first electrodes and a plurality of the second electrodes. One of the plurality of first electrodes are welded to the first pad, and the rest of the first electrodes are not welded to the first pad. The plurality of the second electrodes are correspondingly welded to a plurality of the second pads one by one.

In order to facilitate the understanding of the present application, all reference signs appearing in the present application are listed below:

DETAILED DESCRIPTION OF THE EMBODIMENTS

In order to make the above-mentioned purposes, features and advantages of the present application more apparent and understandable, the specific embodiments of the present application will be described in detail below with reference to the accompanying drawings.

Figure 1:
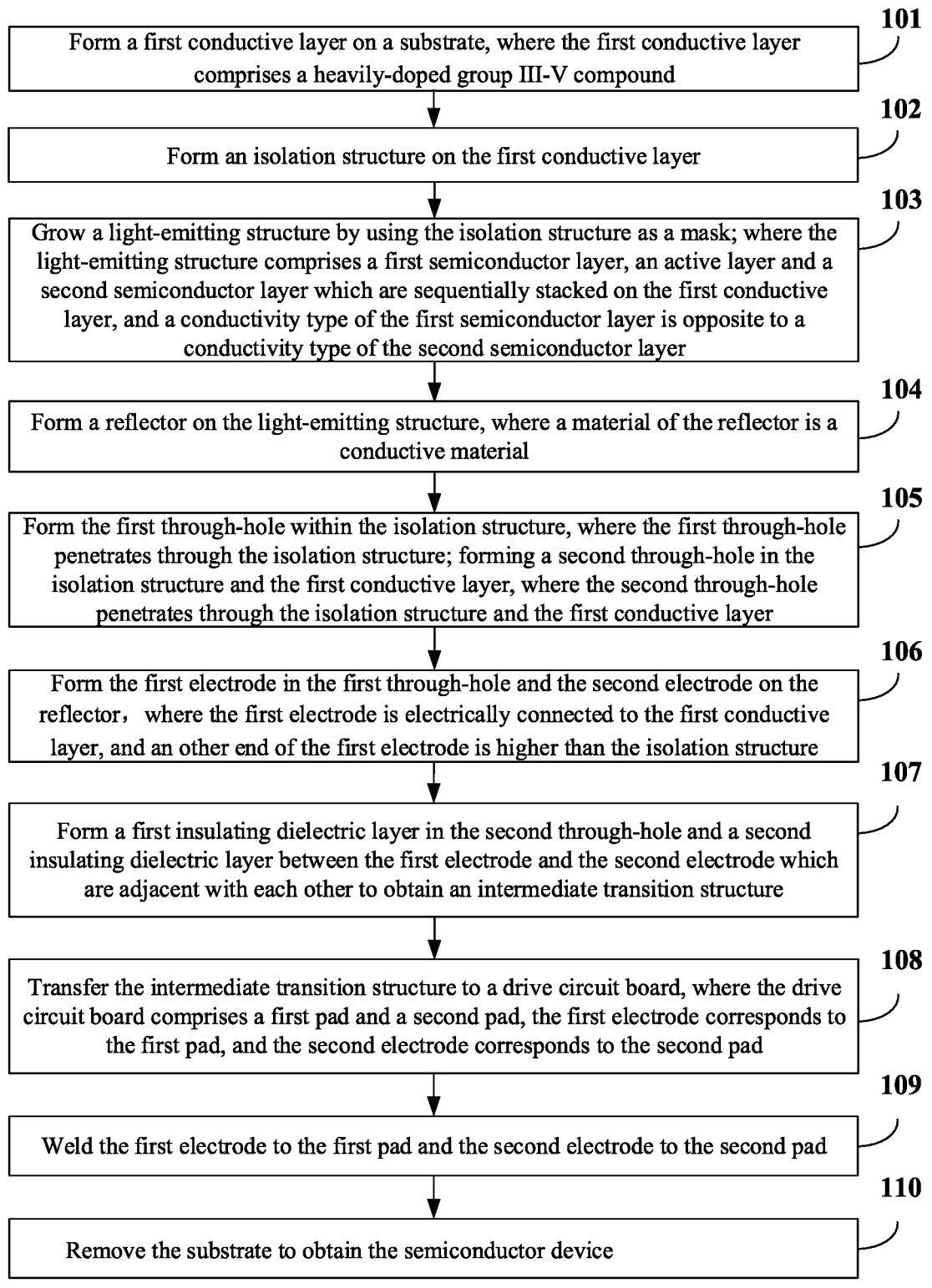
FIG. 1 is a flowchart illustrating a method for manufacturing a semiconductor structure according to the first embodiment of the present application.

FIG. 1 is a flowchart illustrating a method for manufacturing semiconductor structure according to the first embodiment of the present application. FIGS. 2 to 9 are schematic diagrams illustrating intermediate structures corresponding to processes of FIG. 1. FIG. 10 is a schematic diagram of the cross-sectional structure of the semiconductor device of the first embodiment of the present application. As shown in FIG. 1, the method of manufacturing the semiconductor device includes the following steps 101 to 110.

In step S101, a first conductive layer 12 is formed on a substrate 11, and the first conductive layer 12 includes a heavily-doped group III-V compound.

Figure 2:
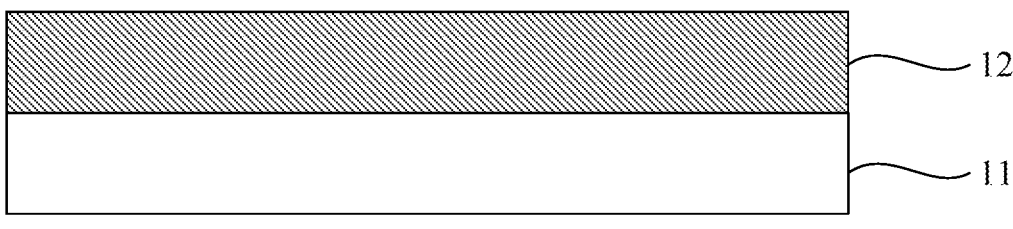
FIGS. 2 to 9 are schematic diagrams illustrating intermediate structures corresponding to processes of FIG. 1.

In step S101, as shown in FIG. 2, the first conductive layer 12 can be formed on the substrate 11 by using an epitaxial process. The epitaxial process may include MOCVD (Metal Organic Chemical Vapor Deposition), MBE (Molecular Beam Epitaxy) or ALD (Atomic Layer Deposition).

In the embodiment, the material of the first conductive layer 12 may include GaN, AlN, AlGaN, InGaN, or AlInGaN, which is not limited herein.

In the embodiment, the doping elements in the first conductive layer 12 include at least one of Si ions, Ge ions, Sn ions, Se ions and Te ions, for example, the doping elements of the first conductive layer 12 include Si ions or includes Si ions, and Sn ions, which is not limited herein.

In this embodiment, the material of the substrate 11 includes silicon. Apparently, the material of the substrate 11 can also include SiC, GaN, or sapphire.

In step S102, the isolation structure 13 is formed on the first conductive layer 12.

Figure 3:
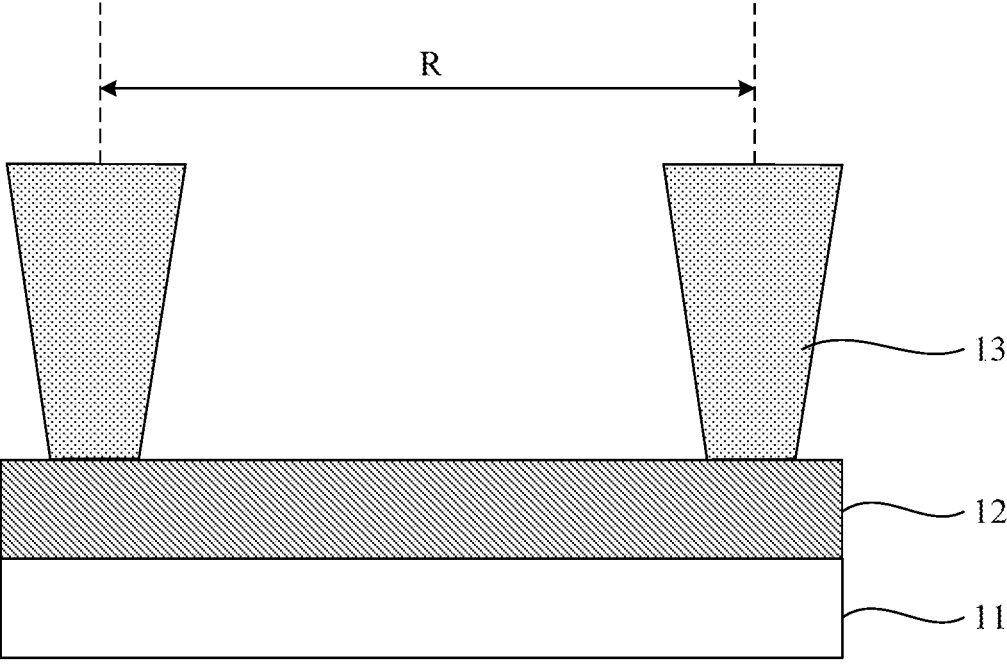

In step S102, as shown in FIG. 3, the isolation structure 13 can be formed on the first conductive layer 12 by using an epitaxial process. The material of the isolation structure 13 is an insulating material. The isolation structure 13 is a hollow structure, the isolation structure 13 encloses a space for accommodating the light-emitting structure 14, and the isolation structure 13 is used to isolate the light-emitting structures 14 which are adjacent with each other. The projection of the isolation structure 13 on the substrate 11 may be annular, for example, may be a circular ring, or a rectangular ring, which is not limited herein.

In the embodiment, as shown in FIG. 3, the average caliber R of the isolation structure 13 is less than or equal to 100 microns. The average caliber R of the isolation structure 13 is the diameter of the circle formed by the center of the sidewall of the isolation structure 13.

In present embodiment, due to the existence of the isolation structure 13, without dry etching for the light-emitting structure 14, the light-emitting structures 14 which are independent with each other can be formed naturally. Therefore, the defects of sidewall of the light-emitting structure 14 caused by dry etching are alleviated.

In step S103, by using the isolation structure 13 as a mask, the light-emitting structure 14 is grown, where light-emitting structure 14 includes a first semiconductor layer 141, an active layer 142 and a second semiconductor layer 143 which are sequentially stacked on the first conductive layer 12. The conductive types of the first semiconductor layer 141 and the second semiconductor layer 143 are opposite.

Figure 4:
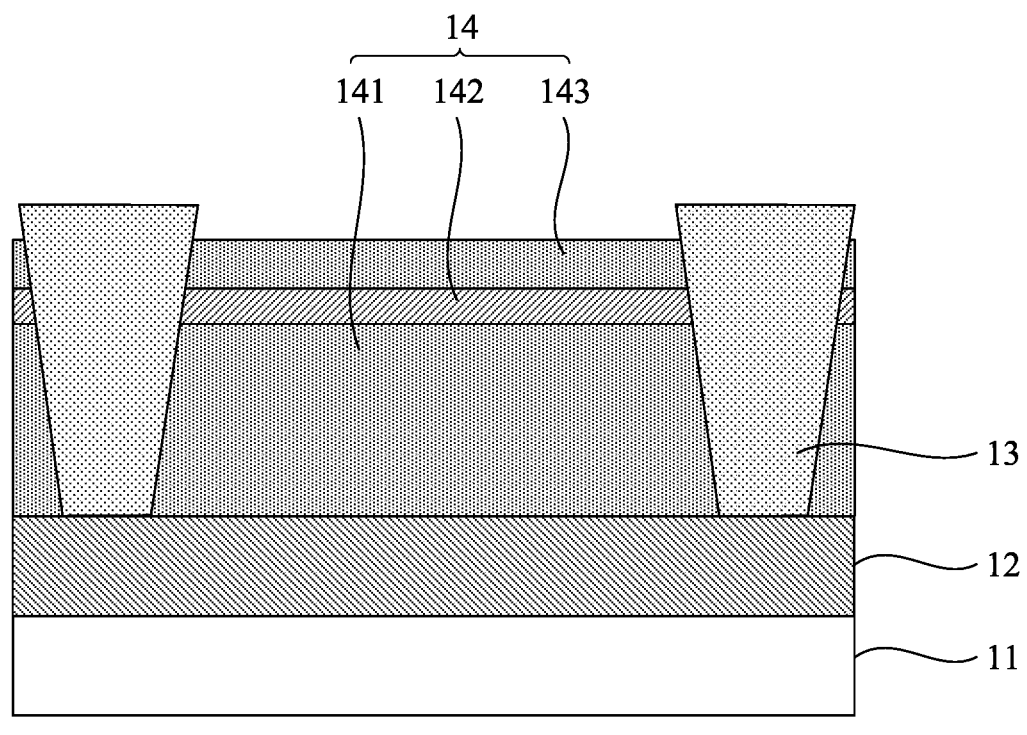

In step S103, as shown in FIG. 4, an epitaxial process can be used to grow the light-emitting structure 14 by using the isolation structure 13 as a mask. The light-emitting structure 14 includes a first semiconductor layer 141, an active layer 142 and a second semiconductor layer 143 which are sequentially stacked on the first conductive layer 12.

In this embodiment, the first semiconductor layer 141 is an N-type semiconductor layer. The material of the first semiconductor layer 141 is a group III-V compound. For example, the material of the first semiconductor layer 141 includes GaN, AlN, AlGaN, InGaN, or AlInGaN. The doping elements of the first semiconductor layer 141 include at least one of Si ions, Ge ions, Sn ions, Se ions, or Te ions. For example, the doping elements of the first semiconductor layer 141 include Si ions, or include Si ions and Sn ions, which is not limited herein.

In the embodiment, the active layer 142 includes a multiple quantum well structure. The multiple quantum well structure may be a periodic structure in which GaN and AlGaN are alternately arranged, or may be a periodic structure in which GaN and AlInGaN are alternately arranged, which is not limited herein.

In the embodiment, the second semiconductor layer 143 is a P-type semiconductor layer, and the material of the second semiconductor layer 143 is a group III-V compound, for example, the material may include GaN, AlN, AlGaN, InGaN, or AlInGaN. The doping elements of the second semiconductor layer 143 include at least one of Mg ions, Zn ions, Ca ions, Sr ions, or Ba ions, for example, the doping elements of the second semiconductor layer 143 include Mg ions, or includes Mg ions and Zn ions, which is not limited herein.

In step S104, a reflector 22 is formed on the light-emitting structure 14, and the material of the reflector 22 is a conductive material.

Figure 5:
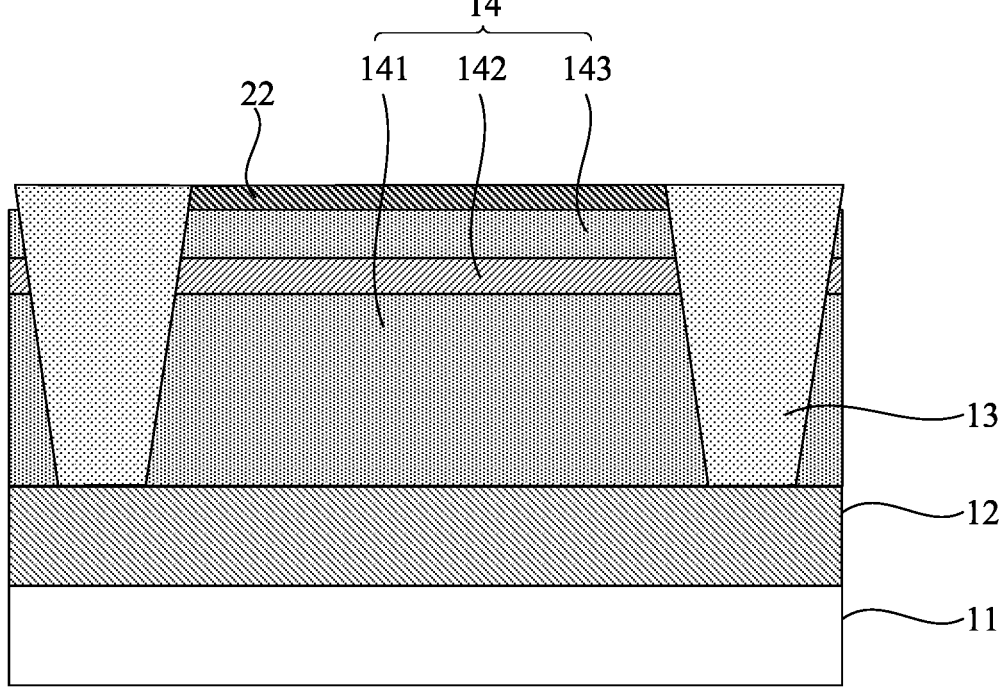

In the embodiment, as shown in FIG. 5, by using PVD (Physical Vapor Deposition) or CVD (Chemical Vapor Deposition), the reflector 22 can be formed on the light-emitting structure 14. The reflector 22 is used to reflect back the light emitted by the light-emitting structure 14.

In the embodiment, the reflector 22 can include a nickel metal layer and a silver metal layer, where the nickel metal layer is located between the light-emitting structure 14 and the silver metal layer; or the reflector 22 can include an indium tin oxide (ITO) layer, a nickel metal layer and a silver metal layer, where the indium tin oxide layer, the nickel metal layer, the silver metal layer are sequentially stacked on the light-emitting structure 14. Apparently, the structure of the reflector 22 is not limited to the structures listed herein.

In step S105, a first through-hole 17 is formed within the isolation structure 13, and the first through-hole 17 penetrates through the isolation structure 13. A second through-hole 18 is formed within the isolation structure 13 and the first conductive layer 12, and the second through-hole 18 penetrates through the isolation structure 13 and the first conductive layer 12.

Figures 6, 7:
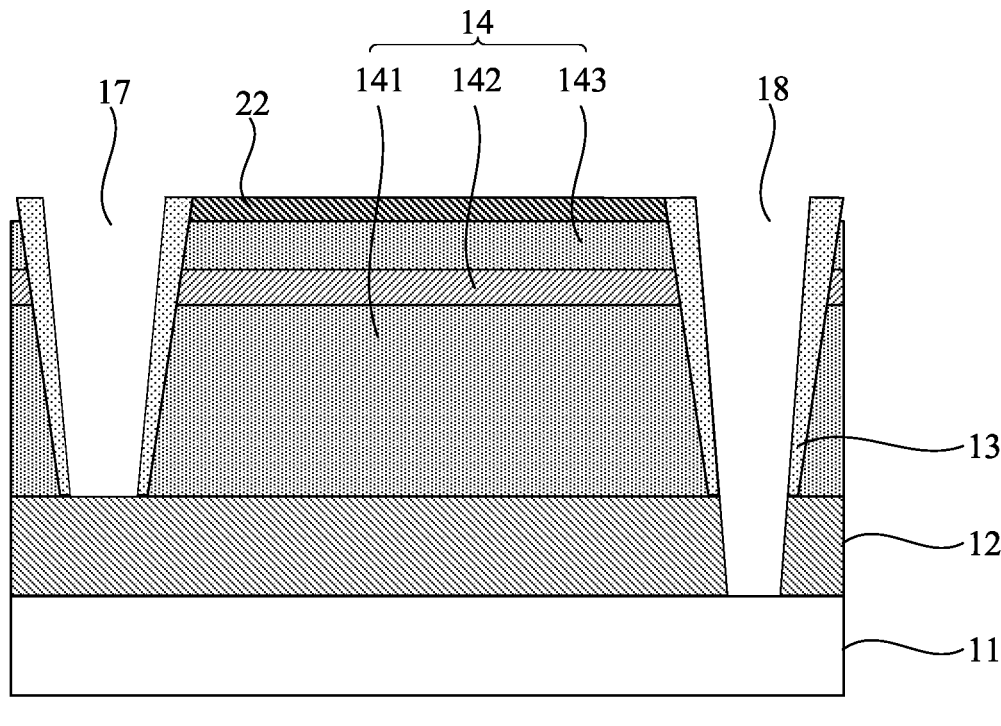

In step S105, as shown in FIG. 6, a dry etching process or a wet etching process can be used to form the first through-hole 17 in the isolation structure 13 and the second through-hole 18 in the isolation structure 13 and the first conductive layer 12. The first through-hole 17 penetrates through the isolation structure 13 to expose a portion of surface of the first conductive layer 12 away from the substrate 11. The second through-hole 18 penetrates through the isolation structure 13 and the first conductive layer 12 to cut off the first conductive layer 12.

In step S106, a first electrode 15 is formed in the first through-hole 17 and a second electrode 16 is formed on the reflector 22, wherein one end of the first electrode 15 is electrically connected to the first conductive layer 12 and the other end is higher than the isolation structure 13.

In the step S106, as shown in FIG. 7, the first through-hole 17 is filled with conductive material to form the first electrode 15, and the reflector 22 is covered with a conductive material to form the second electrode 16, one end of the first electrode 15 is in direct contact with the first conductive layer 12 for electrical connection, and the other end is higher than the isolation structure 13.

In the embodiment, the first electrode 15 may be an N-type electrode, or a cathode, and the material of the first electrode 15 may include at least one of gold, silver, aluminum, nickel, platinum, chromium or titanium. For example, the material of the first electrode 15 may include gold, aluminum, nickel or chromium, which is not limited herein.

In this embodiment, the second electrode 16 may be a P-type electrode, or an anode, and the material of the second electrode 16 may include at least one of gold, silver, aluminum, nickel, platinum, chromium, or titanium. For example, the material of the second electrode 16 may include gold, aluminum, nickel, or chromium, which is not limited herein.

In step S107, a first insulating dielectric layer 19 is formed in the second through-hole 18, and a second insulating dielectric layer 21 is formed between the first electrode 15 and the second electrode 16 which are adjacent with each other to obtain an intermediate transition structure 30.

Figure 8:
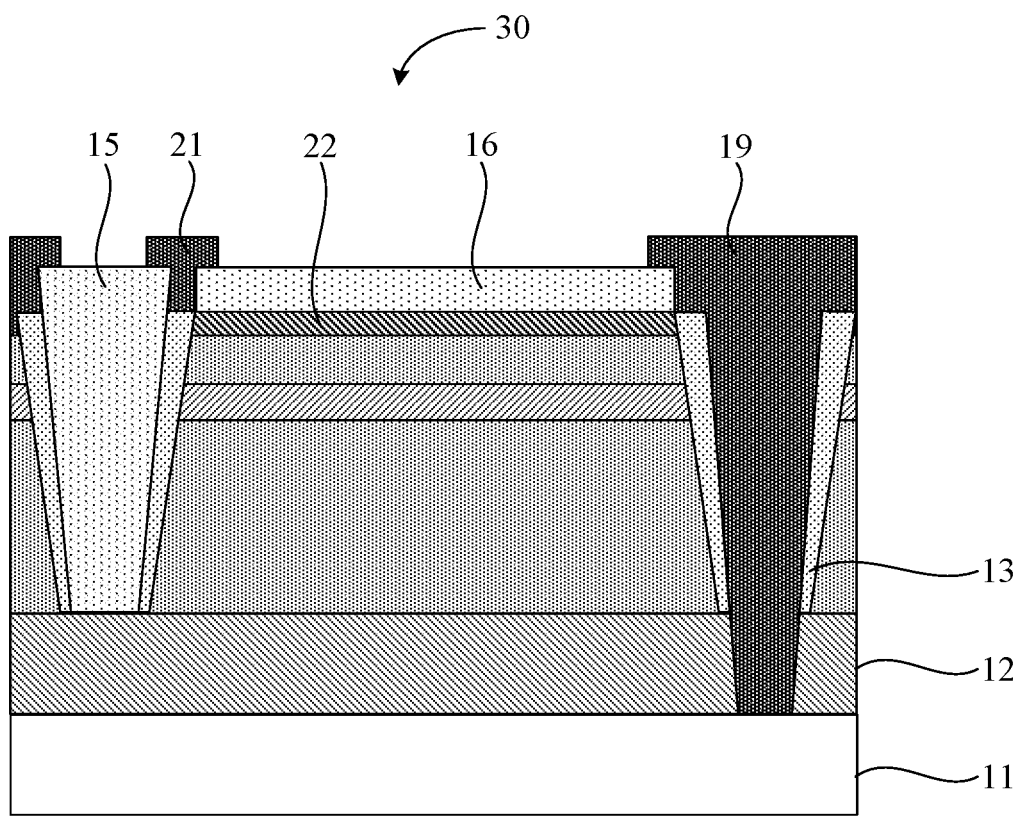

In the step S107, as shown in FIG. 8, an insulating material is filled in the second through-hole 18 to form the first insulating dielectric layer 19, and the insulating material is filled between the first electrode 15 and the second electrode 16 which are adjacent with each other to form the second insulating dielectric layer 21. A side of the first insulating dielectric layer 19 close to the second electrode 16 further covers an end of the second electrode 16 close to the second through-hole 18. The first insulating dielectric layer 19 is used to avoid electric conduction of the first conductive layers 12 which are adjacent with each other, and the second insulating dielectric layer 21 is used to avoid electric conduction of the first electrode 15 and the second electrode 16.

In the embodiment, after forming the first insulating dielectric layer 19 and the second insulating dielectric layer 21, the intermediate transition structure 30 is obtained.

In step S108, the intermediate transition structure 30 is transferred to a drive circuit board 31, which includes a first pad 311 and a second pad 312. The first electrode 15 corresponds to the first pad 311, and the second electrode 16 corresponds to the second pad 312.

Figure 9:
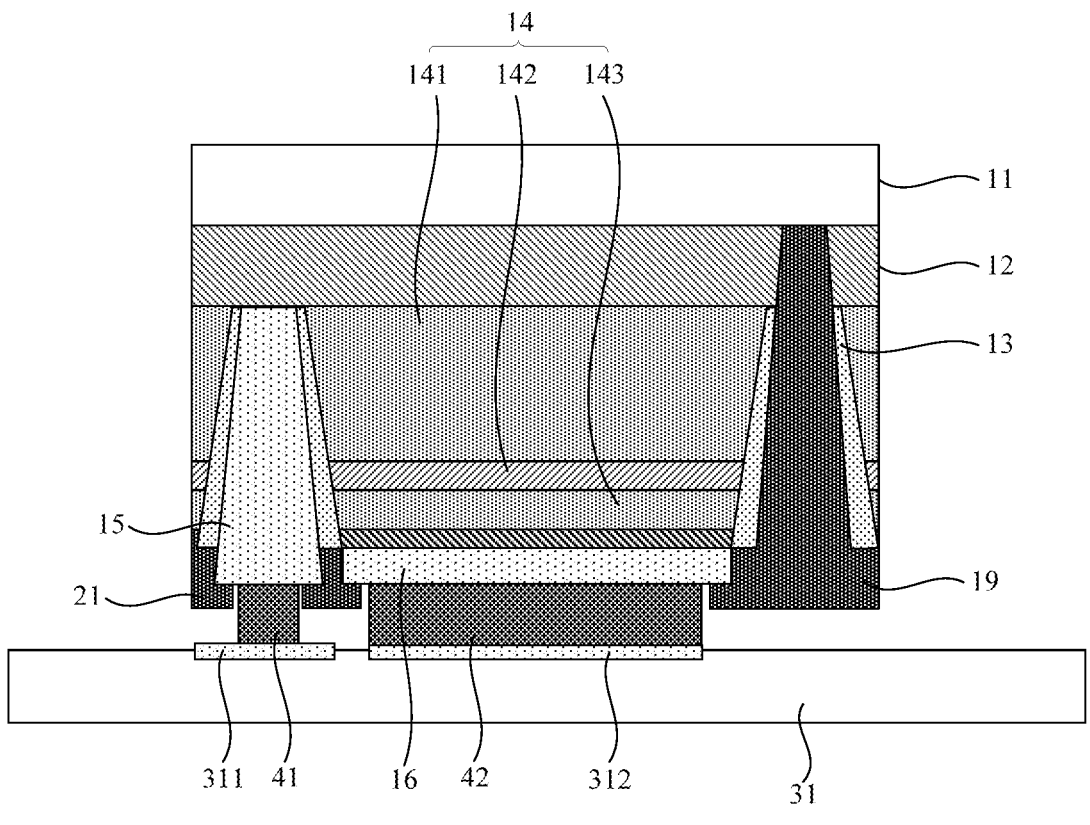
Figure 10:
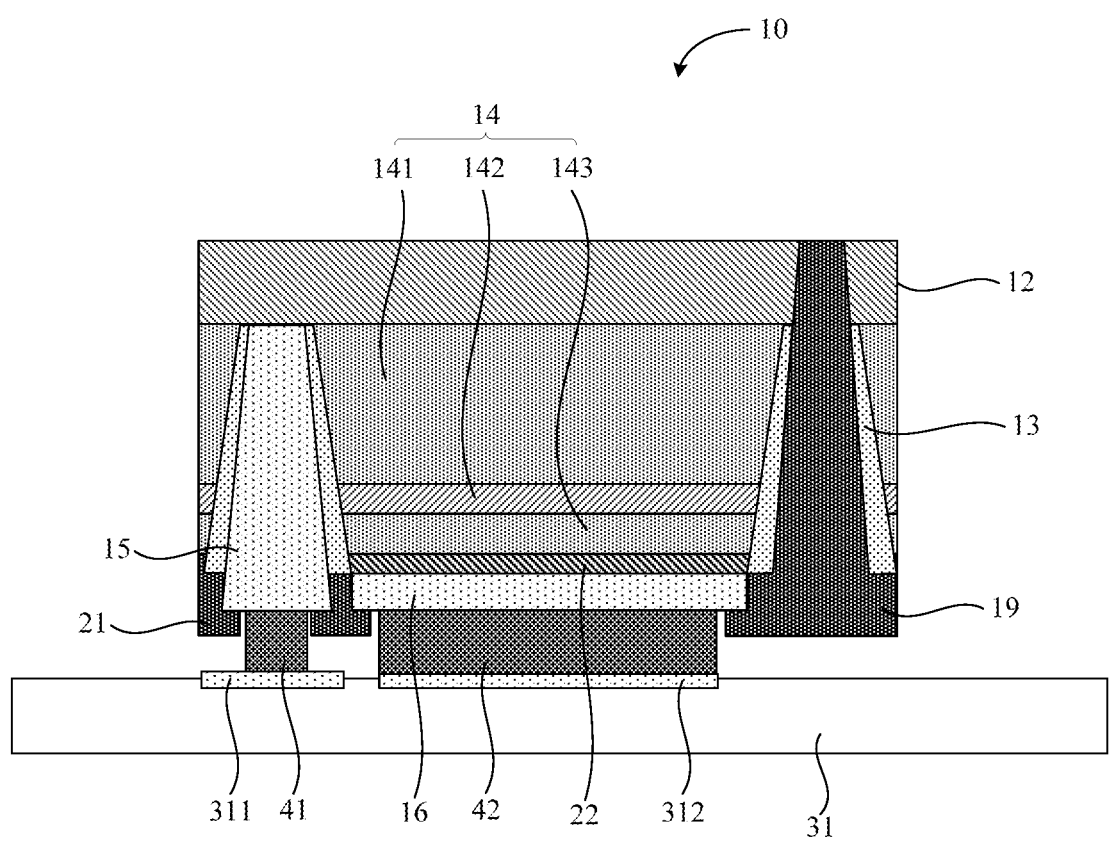
FIG. 10 is a schematic diagram of the cross-sectional structure of the semiconductor device of the first embodiment of the present application.

In step S108, as shown in FIG. 9, the intermediate transition structure 30 is transferred to the drive circuit board 31, where the first electrode 15 in the intermediate transition structure 30 corresponds to the first pad 311 of the drive circuit board 31, and the second electrode 16 in the intermediate transition structure 30 corresponds to the second pad 312 of the drive circuit board 31.

In the embodiment, the drive circuit board 31 includes a drive circuit for driving the light-emitting structure 14 to emit light. The first pad 311 and the second pad 312 are electrically connected to the drive circuit, respectively, and the first pad 311 and the second pad 312 are both conductive.

In step S109, the first electrode 15 is welded to the first pad 311, and the second electrode 16 is welded to the second pad 312.

In the present step, as shown in FIG. 9, by using a welding process, the first electrode 15 can be welded to the first pad 311, and the second electrode 16 is welded to the second pad 312. The first electrode 15 is welded to the first pad 311 by a first welding section 41 and the second electrode 16 is welded to the second pad 312 by a second welding section 42. After welding the first electrode 15 to the first pad 311 and welding the second electrode 16 to the second pad 312, the electrical connection of the light-emitting structure 14 and the drive circuit is realized.

In the embodiment, the material of the first welding section 41 and the second welding section 42 can be a conductive material, for example, the material of the first welding section 41 and the second welding section 42 is a solder paste or a conductive adhesive.

In step S110, the substrate 11 is removed to obtain a semiconductor device.

In step S110, the substrate 11 is stripped by using a stripping process to obtain a semiconductor device as shown in FIG. 10. When the material of the substrate 11 is silicon, the substrate 11 can be removed by wet etching, dry etching, or thinning the substrate 11 by mechanical polishing. When the material of the substrate 11 is sapphire, the laser lift-off (LLO) process is used to remove the substrate 11.

In the embodiment, since the first conductive layer 12 is formed on the substrate 11 before manufacturing the light-emitting structure 14 to manufacture the first electrode 15, the light-emitting structure 14 can no longer be transferred to a temporary carrier plate to remove the substrate 11 and then manufacture the first electrode 15, which can reduce the number of transfers and further avoid the risk of contamination caused by transferring back and forth between different chambers, and thus the yield is improved and the costs are reduce.

FIG. 10 is a schematic diagram of the cross-sectional structure of the semiconductor device of the first embodiment of the present application. As shown in FIG. 10, the semiconductor device includes a first conductive layer 12, an isolation structure 13, a light-emitting structure 14, a reflector 22, a first through-hole 17, a second through-hole 18, a first electrode 15, a second electrode 16, a first insulating dielectric layer 19 and a second insulating dielectric layer 21, and a drive circuit board 31.

In this embodiment, the first conductive layer 12 includes a heavily-doped group III-V compound.

In the embodiment, as shown in FIG. 10, the isolation structure 13 is located on the first conductive layer 12. The light-emitting structure 14 is located in the isolation structure 13. The light-emitting structure 14 includes a first semiconductor layer 141, an active layer 142 and a second semiconductor layer 143 which are sequentially stacked on the first conductive layer 12. A conductive type of the first semiconductor layer 141 is opposite to a conductive type of the second semiconductor layer 143.

In the embodiment, as shown in FIG. 10, the reflector 22 is located between the second electrode 16 and the second semiconductor layer 143, and a material of the reflector 22 is a conductive material.

In the embodiment, as shown in FIG. 10, the first electrode 15 is electrically connected to the first conductive layer 12 through a first through-hole 17 within the isolation structure 13, and the second electrode 16 is located on and electrically connected to the second semiconductor layer 143. The first through-hole 17 is located within and penetrates through the isolation structure 13. The first electrode 15 is located in the first over-hole 17, an end of the first electrode 15 is electrically connected to the first conductive layer 12, and an other end of the first electrode 15 protrudes from the isolation structure 13.

In the embodiment, the second through-hole 18 penetrates through the isolation structure 13 and the first conductive layer 12. As shown in FIG. 10, the first insulating dielectric layer 19 is located in the second through-hole 18 and the second insulating dielectric layer 21 is located between the first electrode 15 and the second electrode 16 which are adjacent with each other.

In the embodiment, as shown in FIG. 10, the drive circuit board 31 includes a first pad 311 and a second pad 312, the first electrode 15 is welded to the first pad 311, and the second electrode 16 is welded to the second pad 312. The first electrode 15 is welded to the first pad 311 by the first welding section 41, and the second electrode 16 is welded to the second pad 312 by the second welding section 42.

Figure 11:
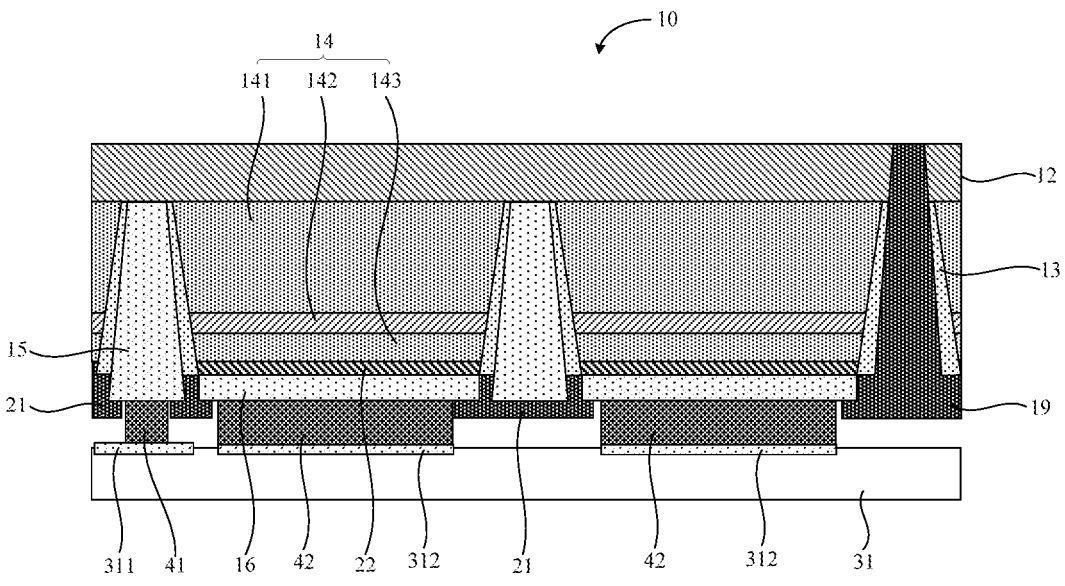
FIG. 11 is a schematic diagram of the cross-sectional structure of the semiconductor device of the second embodiment of the present application.

FIG. 11 is a schematic diagram of the cross-sectional structure of the semiconductor device of the second embodiment of the present application. The semiconductor device 10 in the embodiment can be manufactured by using the manufacturing method of the semiconductor device described in the first embodiment. In the embodiment, adjacent light-emitting structures 14 form a light-emitting unit. The light-emitting structures means that the number of light-emitting structures 14 is greater than one. For example, two or three adjacent light-emitting structures 14 form a light-emitting unit. Only two light-emitting structures 14 in the light-emitting unit are shown in FIG. 11.

As shown in FIG. 11, light-emitting structures 14 in a light-emitting unit are connected in series by the first conductive layer 12. The light-emitting unit further includes a plurality of first electrodes 15 and a plurality of second electrodes 16, a first electrode 15 of the plurality of first electrodes 15 is welded to the first pad 311, the remaining first electrodes 15 are not welded to the first pad 311, and the plurality of second electrodes 16 are welded to the plurality of second pads 312 one by one.

For example, when three adjacent light-emitting structures 14 form a light-emitting unit, the three light-emitting structures 14 in the light-emitting unit are connected in series by the first conductive layer 12. The light-emitting unit includes three first electrodes 15 and three second electrodes 16, one of the three first electrodes 15 is welded on the first pad 311, the remaining two first electrodes 15 are not welded on the first pad 311, and three second electrodes 16 are correspondingly welded on the three second pads 312 one by one. The light-emitting colors of the three light-emitting structures 14 in the light-emitting unit are the first base color, the second base color and the third base color respectively. For example, the light-emitting colors of the three light-emitting structures 14 in the light-emitting unit are red, green and blue, respectively.

In the embodiment, when a plurality of ring-shaped isolation structures 13 are provided on the first conductive layer 12, the side walls of adjacent isolation structures 13 touch each other, or, the adjacent isolation structures 13 share a side wall, and the plurality of isolation structures 13 are in a mesh shape.

Compared with the prior art, the present application has the following beneficial effects. Since the first conductive layer is formed on the substrate to manufacture the electrodes before manufacturing the light-emitting structure, the light-emitting structure can no longer be transferred to a temporary carrier plate to strip the substrate and then manufacture the electrodes, which can reduce the number of transfers and further avoid the risk of contamination caused by the transfers back and forth between different chambers, and thus improve the yield and reduce the cost.

Moreover, due to the existence of the isolation structure, without dry etching for the light-emitting structure, the light-emitting structures independent with each other can be formed naturally. Therefore, the defects of sidewall of the light-emitting structure caused by dry etching are alleviated.

Although the present application discloses the above contents, the present application is not limited herein. One of ordinary skill in the art may make various variants and modifications to the present application without departing from the spirit and scope of the present application. Therefore, the protection scope of the present application should be set forth by the appended claims.

The invention claimed is:

1. A method of manufacturing a semiconductor device, comprising:

forming a first conductive layer on a substrate, wherein the first conductive layer comprises a heavily-doped group III-V compound;

forming an isolation structure on the first conductive layer;

growing a light-emitting structure by using the isolation structure as a mask; wherein the light-emitting structure comprises a first semiconductor layer, an active layer and a second semiconductor layer which are sequentially stacked on the first conductive layer, and a conductivity type of the first semiconductor layer is opposite to a conductivity type of the second semiconductor layer;

forming a first electrode and a second electrode, wherein the first electrode is electrically connected to the first conductive layer through a first through-hole within the isolation structure, and the second electrode is located on the second semiconductor layer and electrically connected to the second semiconductor layer; wherein forming the first electrode and the second electrode comprises: forming the first through-hole within the isolation structure, wherein the first through-hole penetrates through the isolation structure; forming the first electrode in the first through-hole, wherein an end of the first electrode is electrically connected to the first conductive layer and an other end of the first electrode protrudes from the isolation structure; and forming the second electrode on the second semiconductor layer;

forming a second through-hole in the isolation structure and the first conductive layer, wherein the second through-hole penetrates through the isolation structure and the first conductive layer; and forming a first insulating dielectric layer in the second through-hole and forming a second insulating dielectric layer between the first electrode and the second electrode which are adjacent with each other to obtain an intermediate transition structure.

2. The method of manufacturing the semiconductor device according to claim 1, after the intermediate transition structure is obtained, further comprising:

transferring the intermediate transition structure to a drive circuit board, wherein the drive circuit board comprises a first pad and a second pad, the first electrode corresponds to the first pad, and the second electrode corresponds to the second pad;

welding the first electrode to the first pad and the second electrode to the second pad; and removing the substrate to obtain the semiconductor device.

3. The method of manufacturing the semiconductor device according to claim 1, before forming the first electrode and the second electrode, further comprising:

forming a reflector on the light-emitting structure, wherein a material of the reflector is a conductive material.

4. The method of manufacturing the semiconductor device according to claim 1, wherein adjacent multiple light-emitting structures form a light-emitting unit, the multiple light-emitting structures in the light-emitting unit are connected in series by the first conductive layer; the light-emitting unit further comprises a plurality of first electrodes and a plurality of second electrodes, one of first electrodes is welded to a first pad, remaining ones of the first electrodes are not welded to the first pad, and the plurality of the second electrodes are welded to a plurality of second pads one by one.

5. A semiconductor device manufactured according to the method of claim 1, comprising:

the first conductive layer comprising the heavily-doped group III-V compound;

the isolation structure located on the first conductive layer;

the light-emitting structure located in the isolation structure, wherein the light-emitting structure comprises the first semiconductor layer, the active layer and the second semiconductor layer which are sequentially stacked on the first conductive layer, and the conductivity type of the first semiconductor layer is opposite to the conductivity type of the second semiconductor layer; and a first electrode and a second electrode, wherein the first electrode is electrically connected to the first conductive layer through a first through-hole within the isolation structure, and the second electrode is located on and electrically connected to the second semiconductor layer;

wherein the first through-hole is located within the isolation structure and penetrates through the isolation structure, the first electrode is located in the first through-hole, and an end of the first electrode is electrically connected to the first conductive layer and an other end protrudes from the isolation structure; and the semiconductor device further comprises:

a second through-hole penetrating through the isolation structure and the first conductive layer; and a first insulating dielectric layer and a second insulating dielectric layer; wherein the first insulating dielectric layer is located in the second through-hole and the second insulating dielectric layer is located between the first electrode and the second electrode which are adjacent to each other.

6. The semiconductor device according to claim 5, further comprising:

a reflector located between the second electrode and the second semiconductor layer, wherein a material of the reflector is a conductive material.

7. The semiconductor device according to claim 5, further comprising:

a drive circuit board, wherein the drive circuit board comprises a first pad and a second pad, the first electrode is welded to the first pad, and the second electrode is welded to the second pad.

8. The semiconductor device according to claim 5, wherein adjacent multiple light-emitting structures form a light-emitting unit, the multiple light-emitting structures in the light-emitting unit are connected in series by the first conductive layer; the light-emitting unit further comprises a plurality of first electrodes and a plurality of second electrodes, one of the first electrodes is welded to a first pad, remaining ones of the first electrodes are not welded to the first pad, and the plurality of the second electrodes are welded to a plurality of second pads one by one.

9. The semiconductor device according to claim 5, wherein doping elements in the first conductive layer include at least one of Si ions, Ge ions, Sn ions, Se ions or Te ions.

10. The semiconductor device according to claim 5, wherein an average caliber R of the isolation structure is less than or equal to 100 microns; and the average caliber R is a diameter of a circle formed by a center of a sidewall of the isolation structure.

11. The semiconductor device according to claim 5, wherein the first semiconductor layer is an N-type semiconductor layer.

12. The semiconductor device according to claim 5, wherein the second semiconductor layer is a P-type semiconductor layer.

13. The semiconductor device according to claim 6, wherein the reflector includes a nickel metal layer and a silver metal layer; or the reflector includes an indium tin oxide (ITO) layer, a nickel metal layer and a silver metal layer.

14. The semiconductor device according to claim 5, wherein when a plurality of ring-shaped isolation structures are provided on the first conductive layer, side walls of the isolation structures that are adjacent to each other touch each other, or the isolation structures that are adjacent to each other share a side wall, and the plurality of isolation structures are in a mesh shape.

* * * * *